(12) United States Patent
Hiwatashi

(10) Patent No.: US 12,144,105 B2
(45) Date of Patent: Nov. 12, 2024

(54) WIRING BOARD

(71) Applicant: KYOCERA Corporation, Kyoto (JP)

(72) Inventor: Toshihiro Hiwatashi, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 233 days.

(21) Appl. No.: 17/913,050

(22) PCT Filed: Mar. 11, 2021

(86) PCT No.: PCT/JP2021/009763
§ 371 (c)(1),
(2) Date: Sep. 20, 2022

(87) PCT Pub. No.: WO2021/193092
PCT Pub. Date: Sep. 30, 2021

(65) Prior Publication Data
US 2023/0217581 A1  Jul. 6, 2023

(30) Foreign Application Priority Data

Mar. 25, 2020  (JP) ................... 2020-053937

(51) Int. Cl.
*H05K 1/02* (2006.01)
*H05K 1/11* (2006.01)

(52) U.S. Cl.
CPC ........... *H05K 1/0224* (2013.01); *H05K 1/111* (2013.01)

(58) Field of Classification Search
CPC .. H05K 1/0224; H05K 1/0219; H05K 3/4602; H05K 2201/093
See application file for complete search history.

(56) References Cited

U.S. PATENT DOCUMENTS

| 9,544,992 | B2 | 1/2017 | Minich |
| 10,383,213 | B1 | 8/2019 | Chengson et al. |
| 2006/0137905 | A1* | 6/2006 | Kariya .................. H05K 1/162 |
| | | | 174/262 |
| 2010/0002406 | A1* | 1/2010 | Hsu .................. H01L 23/49822 |
| | | | 361/764 |

(Continued)

FOREIGN PATENT DOCUMENTS

WO  2016/067908 A1  5/2016

*Primary Examiner* — Sherman Ng
(74) *Attorney, Agent, or Firm* — Volpe Koenig

(57) ABSTRACT

A wiring board according to the present disclosure includes a core layer including core electrical conductor layers on upper and lower surfaces of a core insulating layer, a first build-up portion, a second build-up portion, a first mounting region, and a second mounting region. The first build-up portion includes a first build-up insulating layer and a first build-up electrical conductor layer connected to the first mounting region. The second build-up portion includes a second build-up insulating layer and a second build-up electrical conductor layer connected to the second mounting region. The second build-up insulating layer includes a margin for adhesion between the second build-up insulating layers or between the second build-up insulating layer and the core insulating layer. The second build-up electrical conductor layer includes an electrical conductor layer for grounding, a first opening, and a signal pad located inside the first opening.

5 Claims, 3 Drawing Sheets

(56) References Cited

U.S. PATENT DOCUMENTS

2011/0018144 A1    1/2011  Horiuchi et al.
2018/0263109 A1*  9/2018  Chen .................... H05K 1/0221
2019/0189164 A1    6/2019  Huddar
2019/0318990 A1* 10/2019  Nakagawa .............. H01L 24/17

* cited by examiner

WIRING BOARD

TECHNICAL FIELD

The present disclosure relates to a wiring board.

BACKGROUND ART

In a known wiring board such as a wiring board described in Patent Document 1, to improve adhesiveness between insulating layers, no electrical conductor is formed in a region with a predetermined width from an outer peripheral edge of each insulating layer, and in this region, there is a margin for adhesion where the insulating layers directly adhere to each other. A wiring conductor such as a signal wiring line is extended from a mounting region in which an electronic component is mounted to the vicinity of the margin for adhesion of the insulating layer in many cases. Due to this, some of signal pads, lands, and the like are also located in the vicinity of the margin for adhesion of the insulating layer.

The pads, the lands, and the like described above are typically surrounded by an electrical conductor layer for grounding with a predetermined gap interposed therebetween in order to block electromagnetic noise coming from the outside. However, the signal pads, the lands, and the like located in the vicinity of the margin for adhesion of the insulating layer are not completely surrounded by the electrical conductor layer for grounding, and are partially open to the margin for adhesion of the insulating layer. When the signal pad, the land, or the like is in the open state, the electromagnetic noise coming from the outside is not sufficiently blocked, which may affect transmission characteristics.

CITATION LIST

Patent Literature

Patent Document 1: WO 2016/067908

SUMMARY

Technical Problem

An object of the present disclosure is to provide a wiring board that can sufficiently block electromagnetic noise coming from the outside while securing favorable adhesiveness between insulating layers.

Solution to Problem

A wiring board according to the present disclosure includes a core layer including a core insulating layer and core electrical conductor layers on upper and lower surfaces of the core insulating layer, a first build-up portion located on an upper surface of the core layer, a second build-up portion located on a lower surface of the core layer, a first mounting region located on an upper surface of the first build-up portion, and a second mounting region located on a lower surface of the second build-up portion. The first build-up portion includes at least one layer of a first build-up insulating layer and a first build-up electrical conductor layer located on an upper surface of the first build-up insulating layer and connected to the first mounting region. The second build-up portion includes at least one layer of a second build-up insulating layer and a second build-up electrical conductor layer located on a lower surface of the second build-up insulating layer and connected to the second mounting region. The second build-up insulating layer includes a margin for adhesion between the second build-up insulating layers or between the second build-up insulating layer and the core insulating layer in a region with a predetermined width from an outer peripheral edge of the second build-up insulating layer. The second build-up electrical conductor layer includes an electrical conductor layer for grounding, a first opening, and a signal pad located inside the first opening and located apart from the electrical conductor layer for grounding. The electrical conductor layer for grounding includes a projecting portion that is continuous with the electrical conductor layer for grounding, projects in a direction approaching the outer peripheral edge, and surrounds the signal pad.

A mounting structure according to the present disclosure includes the wiring board described above, an electronic component mounted on the wiring board, and an electrical substrate connected to the wiring board.

Advantageous Effects of Invention

According to the present disclosure, a wiring board that can sufficiently block electromagnetic noise coming from the outside while securing favorable adhesiveness between insulating layers can be provided.

BRIEF DESCRIPTION OF DRAWINGS

FIG. 3 is a plan view when a second build-up portion and a core layer are viewed from below in FIG. 2.

DESCRIPTION OF EMBODIMENTS

Figure 1:
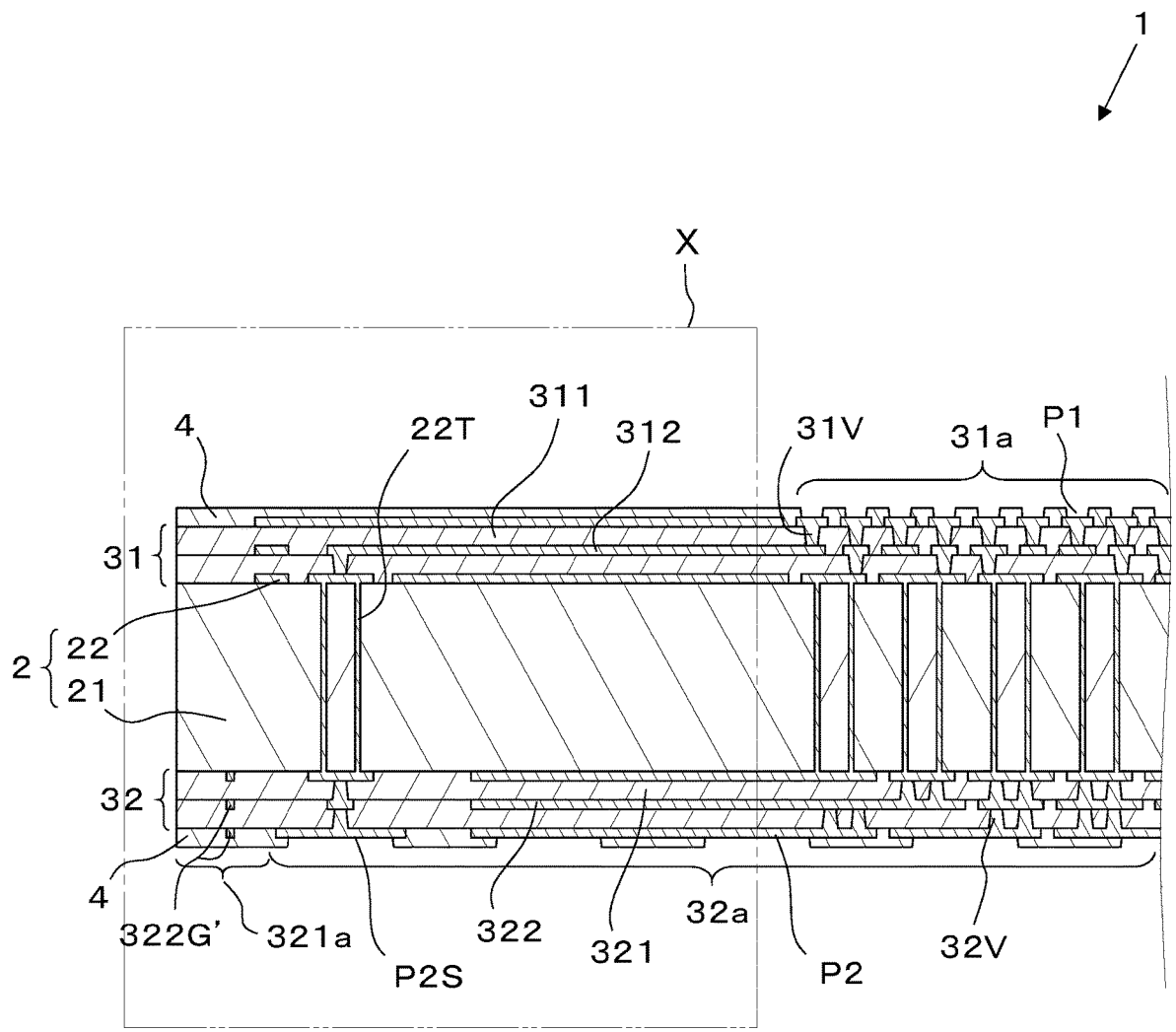
FIG. 1 is a cross-sectional view illustrating a main part of a wiring board according to an embodiment of the present disclosure.

A wiring board according to an embodiment of the present disclosure will be described with reference to FIGS. 1 to 3. FIG. 1 is a cross-sectional view illustrating a main part of a wiring board 1 according to an embodiment of the present disclosure. The wiring board 1 according to the embodiment includes a core layer 2, a first build-up portion 31, a second build-up portion 32, and solder resist 4.

The core layer 2 includes a core insulating layer 21 and core electrical conductor layers 22 located on upper and lower surfaces of the core insulating layer 21. The core insulating layer 21 is not particularly limited as long as it is formed of a material having an insulating property. Examples of the material having an insulating property include resins such as an epoxy resin, a bismaleimide-triazine resin, a polyimide resin, and a polyphenylene ether resin. Two or more of these resins may be mixed and used. The thickness of the core insulating layer 21 is not particularly limited, and is, for example, in a range from 200 μm to 800 μm. The thickness of the core insulating layer 21 is greater than the thickness of a first build-up insulating layer 311 and a second build-up electrical conductor layer 321 described below.

The core insulating layer 21 may contain a reinforcing material. Examples of the reinforcing material include insulating fabric materials such as glass fiber, glass non-woven fabric, aramid non-woven fabric, aramid fiber, and polyester fiber. Two or more types of reinforcing materials may be used in combination. In addition, inorganic insulating fillers made of silica, barium sulfate, talc, clay, glass, calcium carbonate, titanium oxide, or the like may be dispersed in the core insulating layer 21.

A through-hole electrical conductor 22T is located in the core insulating layer 21 in order to electrically connect the upper and lower surfaces of the core insulating layer 21. The through-hole electrical conductor 22T is located inside a through-hole extending through the core insulating layer 21 between the upper and lower surfaces of the core insulating layer 21. The through-hole electrical conductor 22T is formed with metal such as copper, specifically, formed with metal plating such as copper plating.

The through-hole electrical conductor 22T connects the core electrical conductor layers 22 located on the upper and lower surfaces of the core insulating layer 21. The through-hole electrical conductor 22T may be located only on the inner wall surface of the through-hole as illustrated in FIG. 1, or the through-hole may be filled with the through-hole electric conductor 22T. The core electrical conductor layer 22 is formed with metal such as copper, specifically, formed with metal foil such as copper foil or metal plating such as copper plating.

As the through-hole electrical conductor 22T, there exist a grounding through-hole electrical conductor, a power supply through-hole electrical conductor, and a signal through-hole electrical conductor in accordance with the core electrical conductor layers 22 to be connected. In other words, the grounding through-hole electrical conductor is connected to a grounding electrical conductor, the power supply through-hole electrical conductor is connected to a power supply electrical conductor, and the signal through-hole electrical conductor is connected to a signal electrical conductor.

The first build-up portion 31 is located on the upper surface of the core layer 2, and the second build-up portion 32 is located on the lower surface of the core layer 2.

The first build-up portion 31 has a structure in which the first build-up insulating layers 311 and the first build-up electrical conductor layers 312 are alternately layered. A first via-hole electrical conductor 31V is located in the first build-up insulating layer 311 in order to electrically connect the upper and lower surfaces of the first build-up insulating layer 311. The first via-hole electrical conductor 31V electrically connects the first build-up electrical conductor layers 312 facing each other in an up-down direction with the first build-up insulating layer 311 interposed therebetween, or connects the first build-up electrical conductor layer 312 and the core electrical conductor layer 22.

The second build-up portion 32 has a structure in which the second build-up insulating layers 321 and the second build-up electrical conductor layers 322 are alternately layered. A second via-hole electrical conductor 32V is located in the second build-up insulating layer 321 in order to electrically connect the upper and lower surfaces of the second build-up insulating layer 321. The second via-hole electrical conductor 32V electrically connects the second build-up electrical conductor layers 322 facing each other in an up-down direction with the second build-up insulating layer 321 interposed therebetween, or connects the second build-up electrical conductor layer 322 and the core electrical conductor layer 22.

The first via-hole electrical conductor 31V and the second via-hole electrical conductor 32V are located inside via-holes extending through the first build-up insulating layer 311 and the second build-up insulating layer 321 between the upper and lower surfaces of the first build-up insulating layer 311 and the second build-up insulating layer 321, respectively. The first via-hole electrical conductor 31V and the second via-hole electrical conductor 32V are each formed with metal such as copper, specifically, formed with metal plating such as copper plating.

The via-holes may be filled with the first via-hole electrical conductor 31V and the second via-hole electrical conductor 32V as illustrated in FIG. 1, or the first via-hole electrical conductor 31V and the second via-hole electrical conductor 32V may each be located only on the inner wall surface of the via-holes. The first via-hole electrical conductor 31V and the second via-hole electrical conductor 32V each include a grounding via-hole electrical conductor, a power supply via-hole electrical conductor, and a signal via-hole electrical conductor in accordance with the first build-up electrical conductor layers 312 to be connected and the second build-up electrical conductor layers 322 to be connected. In other words, the grounding via-hole electrical conductor is connected to a grounding electrical conductor, the power supply via-hole electrical conductor is connected to a power supply electrical conductor, and the signal via-hole electrical conductor is connected to a signal electrical conductor.

The materials of the first build-up insulating layer 311 and the second build-up insulating layer 321, similar to the core insulating layer 21, are not particularly limited to any specific materials as long as the materials have an insulating property. Examples of the material having an insulating property include resins such as an epoxy resin, a bismaleimide-triazine resin, a polyimide resin, and a polyphenylene ether resin. Two or more of these resins may be mixed and used.

The materials of first build-up electrical conductor layer 312 and the second build-up electrical conductor layer 322, similar to the core electrical conductor layer 22, are not particularly limited to any specific materials as long as the layers are made of electrical conductors. The first build-up electrical conductor layer 312 and the second build-up electrical conductor layer 322 are each formed with metal such as copper, specifically, formed with metal foil such as copper foil or metal plating such as copper plating.

In the wiring board 1 according to the embodiment, two layers of the first build-up insulating layers 311 are present, and two layers of the second build-up insulating layers 321 are present. In this case, each of the insulating layers may be formed of the same resin or may be formed of different resins. The core insulating layer 21, the first build-up insulating layer 311, and the second build-up insulating layer 321 may be formed of the same resin or may be formed of different resins.

Inorganic insulating fillers made of silica, barium sulfate, talc, clay, glass, calcium carbonate, titanium oxide or the like may be dispersed in the first build-up insulating layer 311 and the second build-up insulating layer 321. The thickness of each of the first build-up insulating layer 311 and the second build-up insulating layer 321 is not particularly limited, and is, for example, in a range from 25 µm to 50 µm. When two or more layers of the first build-up insulating layers 311 and two or more layers of the second build-up insulating layers 321 are present, each of the insulating layers may have the same thickness or may have a different thickness.

The first build-up portion 31 includes a first mounting region 31a on the surface thereof. The first mounting region 31a includes a plurality of first pads P1 formed of part of the first build-up electrical conductor layer 312 located in the outermost layer.

Electronic components such as a semiconductor integrated circuit element are mounted in the first mounting region 31a via solder. The electronic components are not limited as long as those are generally electronic components mounted on the wiring board. Examples of such electronic components include an optoelectronic element or the like in addition to the above-described semiconductor integrated circuit element.

The second build-up portion 32 includes a second mounting region 32a on the surface thereof. The second mounting region 32a includes a plurality of second pads P2 formed of part of the second build-up electrical conductor layer 322 located in the outermost layer. The second pad P2 provided in the second mounting region 32a has a larger diameter than that of the first pad P1 provided in the first mounting region 31a. In the second mounting region 32a, an electrical substrate such as a mother board is mounted via solder. In the wiring board 1 according to the embodiment, the electronic component and the electrical substrate described above are mounted, and the wiring board 1 is used as a mounting structure.

The solder resist 4 is formed on part of both surfaces of the wiring board 1 according to the embodiment. The solder resist 4 is formed of, for example, an acryl-modified epoxy resin. The solder resist 4 has a function to protect the first build-up electrical conductor layer 312 and the second build-up electrical conductor layer 322 from the heat when the electronic component is mounted in the first mounting region 31a, or the heat when the second mounting region 32a is connected to the mother board or the like, for example.

As illustrated in FIG. 1, in the wiring board 1 according to the embodiment, the second mounting region 32a is separated from the outer peripheral edge of the second build-up insulating layer 321 by a margin for adhesion 321a located with a predetermined width from the outer peripheral edge of the second build-up insulating layer 321. In other words, the second mounting region 32a is surrounded by the margin for adhesion 321a. The margin for adhesion 321a including the outer peripheral edge of the second build-up insulating layer 321 is basically in a state in which an electrical conductor or the like is not located therein, and the second build-up insulating layers 321 directly adhere to each other, or the second build-up insulating layer 321 directly adheres to the core insulating layer 21. The margin for adhesion 321a is provided to improve the adhesiveness between the second build-up insulating layers 321 or between the second build-up insulating layer 321 and the core insulating layer 21.

The second pads P2 provided in the second mounting region 32a include a power supply second pad, a signal second pad P2S, and a grounding second pad. As illustrated in FIG. 1, at least the signal second pad P2S is located at the outermost column (the margin for adhesion 321a side) of the second mounting region 32a.

Figure 2:
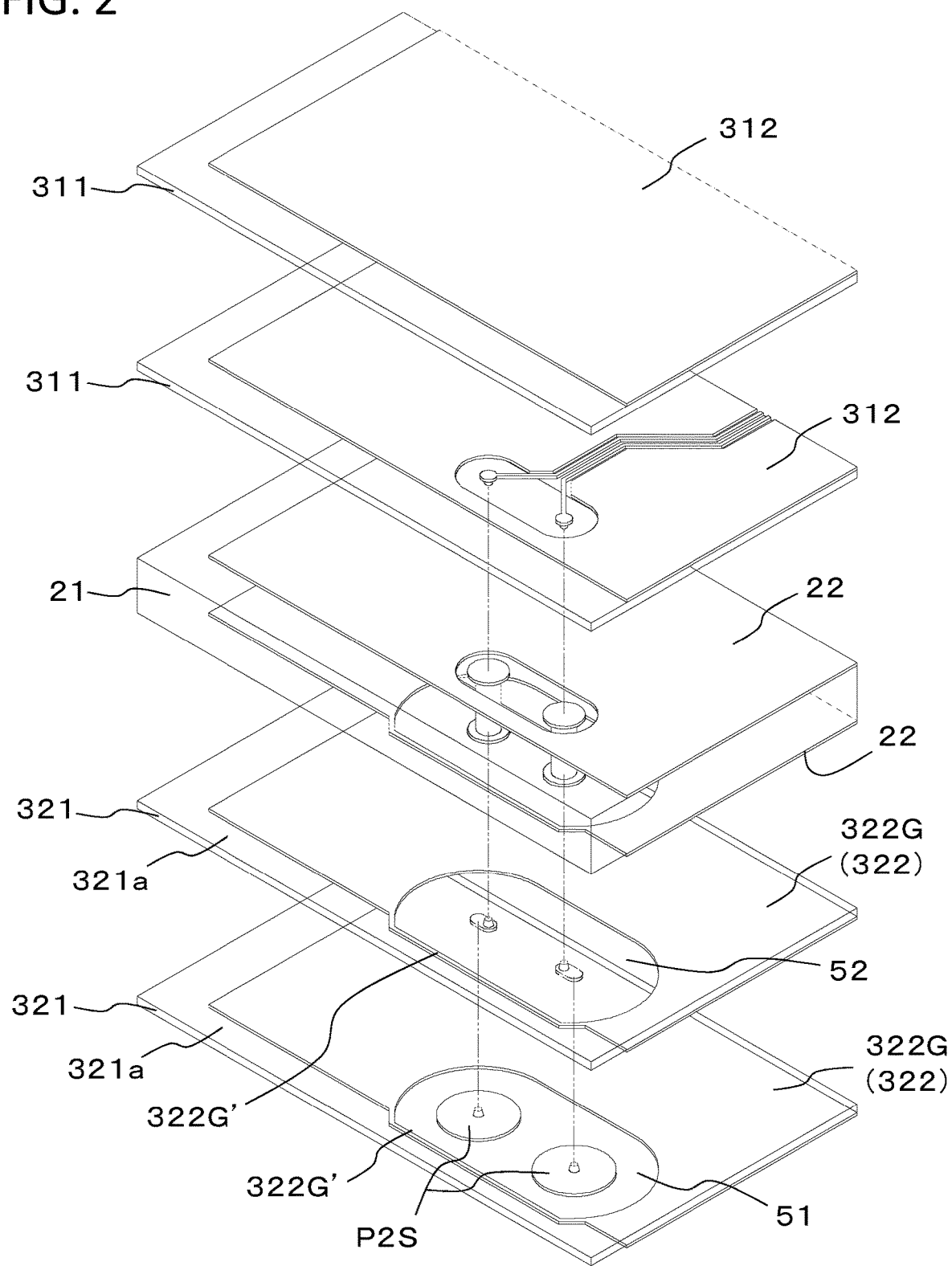
FIG. 2 is a perspective view schematically illustrating each of layers in a state in which solder resist is removed in a region X indicated in FIG. 1.

As illustrated in FIG. 2, the signal second pad P2S located at the outermost column of the second mounting region 32a is present inside a first opening 51 formed in an electrical conductor layer for grounding 322G located in the same layer as the signal second pad P2S, with a gap interposed between the electrical conductor layer for grounding 322G and the signal second pad P2S. FIG. 2 is a perspective view schematically illustrating each of the layers in a state in which the solder resist 4 is removed in a region X indicated in FIG. 1.

As illustrated in FIG. 2, in the vicinity of the first opening 51, part of the electrical conductor layer for grounding 322G is present as a strip-shaped body 322G' in the margin for adhesion 321a of the second build-up insulating layer 321. The strip-shaped body 322G' is described below on the basis of FIGS. 3A-3C.

Figure 3A:
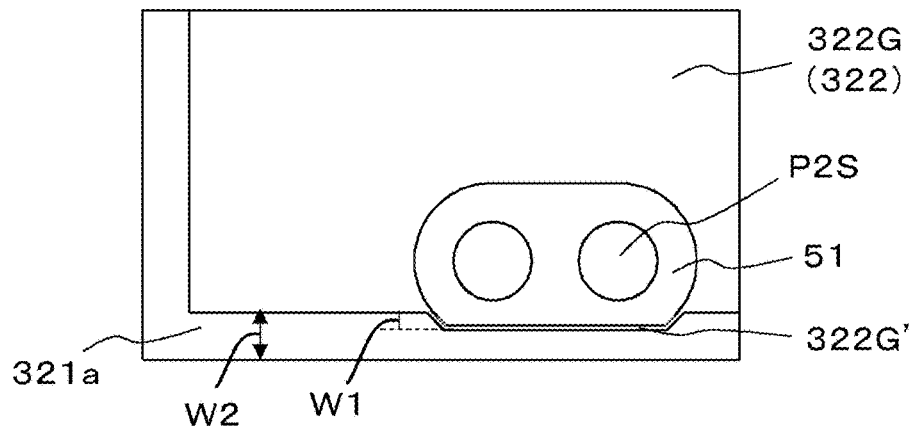
FIG. 3A and FIG. 3B each illustrate a plan view when the second build-up portion is viewed from below.
Figure 3B:
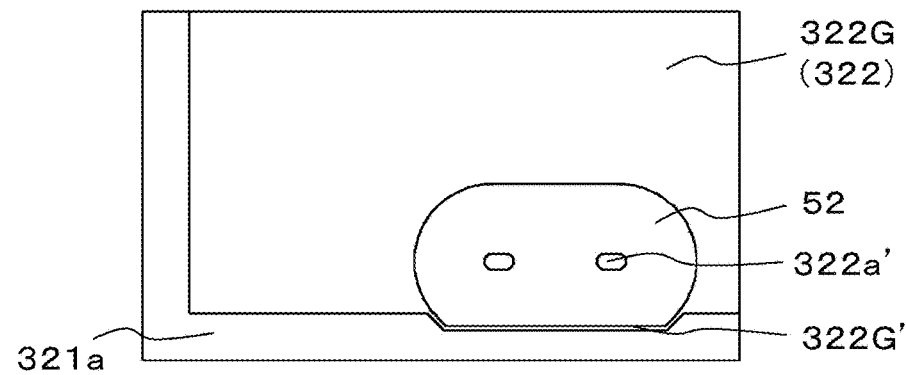
Figure 3C:
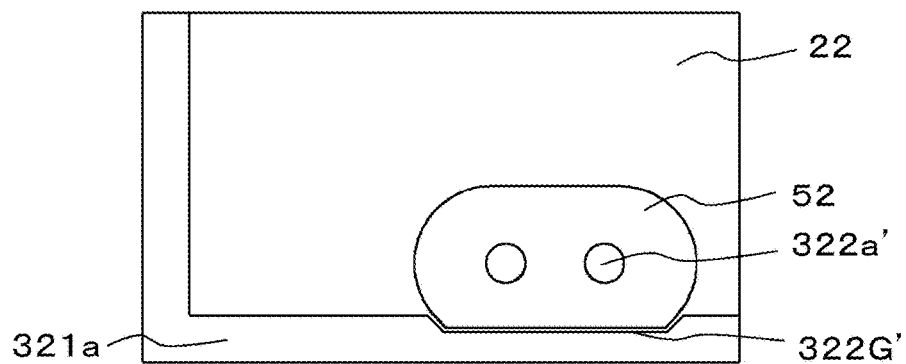
FIG. 3C is a plan view when the core layer is viewed from below.

FIG. 3 is a plan view when the second build-up portion 32 and the core layer 2 are viewed from below in FIG. 2. FIG. 3A is a plan view of the second build-up insulating layer 321 and the second build-up electrical conductor layer 322 located in the outermost layer of the second build-up insulating layers 321 and the second build-up electrical conductor layers 322 included in the second build-up portion 32 when viewed from below. FIG. 3B is a plan view of the second build-up insulating layer 321 and the second build-up electrical conductor layer 322 located on the core layer 2 side by one layer from the outermost layer of the second build-up insulating layers 321 and the second build-up electrical conductor layers 322 included in the second build-up portion 32 when viewed from below. FIG. 3C is a plan view when the core layer 2 is viewed from below.

As illustrated in FIG. 3A, the electrical conductor layer for grounding 322G includes a projecting portion projecting in a direction approaching the outer peripheral edge of the second build-up insulating layer 321 to surround the signal second pad P2S. That is, the periphery of the signal second pad P2S is completely surrounded by the electrical conductor layer for grounding 322G including the strip-shaped body 322G'. The strip-shaped body 322G' projects from the outer peripheral side of the (planar) electrical conductor layer for grounding 322G by W1 in a direction approaching the outer peripheral edge of the second build-up insulating layer 321. In this way, the strip-shaped body 322G' projects by W1 to completely surround the periphery of the signal second pad P2S, which is advantageous from the perspective of reducing noise coming from the outside to the signal second pad P2S, while preventing a short-circuit, and reducing electrostatic capacitance. Furthermore, since the strip-shaped body 322G', unlike the planar layer, is relatively narrow in width, it is easy to dig into the second build-up insulating layer 321 in the margin for adhesion 321a. Accordingly, the adhesiveness between the second build-up insulating layers 321 is not affected.

The dimension W1 indicating the projection of the strip-shaped body 322G' is not limited as long as the dimension W1 refers to a width that does not affect the short-circuit prevention, the adhesiveness, or the like. The dimension W1 may be, for example, in a range from 50 μm to 250 μm in order not to substantially affect the short-circuit prevention, the adhesiveness between the second build-up insulating layers 321, or the like. An average width W2 from the outer peripheral edge of the second build-up insulating layer 321 to the outer peripheral side of the (planar) electrical conductor layer for grounding 322G (width other than the width to the strip-shaped body 322G') is not limited as long as the second build-up insulating layers 321 can adhere to each other. For example, W2 may be in a range from 300 μm to 500 μm. When W2 is less than 300 μm, it is difficult to secure the adhesiveness in some cases; when W2 is greater than 500 μm, it is difficult in some cases to secure the region in which the electrical conductor layer is formed.

The width of the strip-shaped body 322G', which is part of the electrical conductor layer for grounding 322G, is not limited as long as the shape thereof takes a strip shape. The strip-shaped body 322G' may have a width in a range from 20 μm to 50 μm, for example. When the strip-shaped body 322G' has such a width, the strip-shaped body 322G' is unlikely to be excessively thick, and it is possible to further prevent a decrease in insulation reliability between the upper- and lower-positioned second build-up electrical conductor layers 322. Furthermore, it is possible to make the adhesiveness between the second build-up insulating layers 321 less likely to be affected.

As illustrated in FIGS. 3B and 3C, a structure similar to the structure illustrated in FIG. 3A is also employed for the second build-up insulating layer 321 and the second build-up electrical conductor layer 322 located in the layer other than the outermost layer, the core insulating layer 21, and the core electrical conductor layer 22. That is, the above structure is the same as the structure illustrated in FIG. 3A except that a land 322a' to be electrically connected to the signal second pad P2S is provided in place of the signal second pad P2S.

As illustrated in FIGS. 3B and 3C, like the signal second pad P2S, the land 322a' is present inside a second opening 52 formed in the electrical conductor layer for grounding 322G located in the same layer as the land 322a', with a gap interposed between the electrical conductor layer for grounding 322G and the land 322a'. The second opening 52 refers to an opening in which there exists the land 322a' electrically connected to the signal second pad P2S located at the outermost column in the second mounting region 32a, at the lower surface of the core insulating layer 21 and the lower surface of the second build-up insulating layer 321 located in the layer other than the outermost layer.

As illustrated in FIGS. 3B and 3C, the land 322a' is generally smaller than the signal second pad P2S. Because of this, the second opening 52 may be smaller than the first opening 51. However, when the second opening 52 is made small, and, for example, the signal second pad P2S and the electrical conductor layer for grounding 322G mutually having different potentials face each other via the second build-up insulating layer 321, the facing portion forms a capacitor and electrostatic capacitance is increased, thereby causing impedance mismatching. Therefore, when the second build-up electrical conductor layer 322 present in the second build-up portion 32 is seen through in a plan view, the second opening 52 is preferably present at a position overlapping with the first opening 51. The first opening 51 and the second opening 52 preferably have substantially the same size and overlap with each other at substantially the same position.

The wiring board of the present disclosure is not limited to the embodiment described above. For example, in the wiring board 1 described above, a pair pad is employed as the signal second pad P2S. However, the signal second pad P2S is not limited to the pair pad, and a single pad may be employed.

In the wiring board 1 described above, two layers of the first build-up insulating layers 311 are present in the first build-up portion 31, and two layers of the second build-up insulating layers 321 are present in the second build-up portion 32. However, in the wiring board 1 of the present disclosure, one layer or more than two layers of the first build-up insulating layers 311 may be present, and one layer or more than two layers of the second build-up insulating layers 321 may be present.

REFERENCE SIGNS LIST

1 Wiring board
2 Core layer
21 Core insulating layer
22 Core electrical conductor layer
22T Through-hole electrical conductor
31 First build-up portion
311 First build-up insulating layer
312 First build-up electrical conductor layer
31a First mounting region
31V First via-hole electrical conductor
32 Second build-up portion
321 Second build-up insulating layer
321a Margin for adhesion
322 Second build-up electrical conductor layer
322G Electrical conductor layer for grounding
322G' Strip-shaped body
32a Second mounting region
32V Second via-hole electrical conductor
4 Solder resist
51 First opening
52 Second opening
P1 First pad
P2 Second pad
P2S Signal second pad

The invention claimed is:
1. A wiring board comprising:
a core layer comprising a core insulating layer and core electrical conductor layers on upper and lower surfaces of the core insulating layer;
a first build-up portion located on an upper surface of the core layer;
a second build-up portion located on a lower surface of the core layer;
a first mounting region located on an upper surface of the first build-up portion; and
a second mounting region located on a lower surface of the second build-up portion,
wherein the first build-up portion comprises at least one layer of a first build-up insulating layer and a first build-up electrical conductor layer located on an upper surface of the first build-up insulating layer and connected to the first mounting region,
the second build-up portion comprises at least one layer of a second build-up insulating layer and a second build-up electrical conductor layer located on a lower surface of the second build-up insulating layer and connected to the second mounting region,
the second build-up insulating layer comprises a margin for adhesion between the second build-up insulating layers or between the second build-up insulating layer and the core insulating layer in a region with a predetermined width from an outer peripheral edge of the second build-up insulating layer,
the second build-up electrical conductor layer comprises an electrical conductor layer for grounding, a first opening, and a signal pad located inside the first opening and located apart from the electrical conductor layer for grounding, and
the electrical conductor layer for grounding comprises a projecting portion that is continuous with the electrical conductor layer for grounding, projects in a direction approaching the outer peripheral edge, and surrounds the signal pad.
2. The wiring board according to claim 1,
wherein a width from the outer peripheral edge to the electrical conductor layer for grounding other than the projecting portion is in a range from 300 μm to 500 μm.

3. The wiring board according to claim 1,
wherein the projecting portion is a strip-shaped body with a width in a range from 20 μm to 50 μm.

4. The wiring board according to claim 1,
wherein a projecting dimension of the projecting portion is in a range from 20 μm to 50 μm.

5. The wiring board according to claim 1,
wherein the signal second pad is present in pairs inside the first opening.

\* \* \* \* \*